(12) United States Patent
Hong et al.

(10) Patent No.: US 10,532,377 B2
(45) Date of Patent: Jan. 14, 2020

(54) MASK ASSEMBLY FOR THIN FILM DEPOSITION

(71) Applicant: Samsung Display Co., Ltd., Yongin-si (KR)

(72) Inventors: Jaemin Hong, Yongin-si (KR); Hyunseung Kang, Yongin-si (KR); Hanul Kwen, Yongin-si (KR); Jeunghoon Kim, Yongin-si (KR); Hanyoung Kim, Yongin-si (KR); Younghoon Roh, Yongin-si (KR); Jihye Seo, Yongin-si (KR); Wooyoung Jung, Yongin-si (KR); Pilseon Ji, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 653 days.

(21) Appl. No.: 14/882,902

(22) Filed: Oct. 14, 2015

(65) Prior Publication Data
US 2016/0296966 A1    Oct. 13, 2016

(30) Foreign Application Priority Data

Apr. 13, 2015 (KR) .......................... 10-2015-0052076

(51) Int. Cl.
| | |
|---|---|
| *B05D 1/32* | (2006.01) |
| *B05C 21/00* | (2006.01) |
| *C23C 14/04* | (2006.01) |
| *B05B 12/20* | (2018.01) |

(52) U.S. Cl.
CPC ................ *B05D 1/32* (2013.01); *B05B 12/20* (2018.02); *B05C 21/005* (2013.01); *C23C 14/042* (2013.01)

(58) Field of Classification Search
CPC ......... B05D 1/32; B05C 21/005; B05B 12/20; C23C 14/042
See application file for complete search history.

(56) References Cited

U.S. PATENT DOCUMENTS

| 4,919,076 | A | * | 4/1990 | Lutz ...................... C23C 14/042 |
| | | | | 118/505 |
| 2004/0020435 | A1 | * | 2/2004 | Tsuchiya ............... C23C 14/042 |
| | | | | 118/723 VE |
| 2005/0115503 | A1 | | 6/2005 | Hagiwara et al. |

(Continued)

FOREIGN PATENT DOCUMENTS

| KR | 1020040028661 | 4/2004 |
| KR | 1020050053326 | 6/2005 |

(Continued)

*Primary Examiner* — Dah-Wei D. Yuan
*Assistant Examiner* — Stephen A Kitt
(74) *Attorney, Agent, or Firm* — H.C. Park & Associates, PLC

(57) ABSTRACT

A mask assembly for thin film deposition includes: a mask frame including an opening, the mask frame disposed surrounding the opening; and a mask unit including: first masks mounted on the mask frame, the first masks extending in a first direction; a second mask disposed on the first masks, the second mask including: one open hole; and at least one foreign substance discharge hole; and a third mask disposed on the second mask, the third mask extending in a second direction and including deposition holes, wherein the second direction crosses the first direction, and wherein a substrate is disposed on the third mask.

20 Claims, 13 Drawing Sheets

(56) References Cited

U.S. PATENT DOCUMENTS

2008/0018236 A1 1/2008 Arai et al.
2011/0146573 A1* 6/2011 Park ..................... C23C 14/042
                                                             118/712
2012/0325143 A1* 12/2012 Kang .................... C23C 14/042
                                                             118/504

FOREIGN PATENT DOCUMENTS

KR    1020070101842    10/2007
KR    1020100000129     1/2010

* cited by examiner

MASK ASSEMBLY FOR THIN FILM DEPOSITION

CROSS-REFERENCE TO RELATED APPLICATION

This application claims priority from and the benefit of Korean Patent Application No. 10-2015-0052076, filed on Apr. 13, 2015, which is hereby incorporated by reference for all purposes as if fully set forth herein.

BACKGROUND

Field

Exemplary embodiments relate to a mask assembly for thin film deposition.

Discussion of the Background

Conventionally, an organic light-emitting display apparatus having a thin-film transistor may be included in mobile devices, such as smartphones, tablet personal computers, laptop computers, digital cameras, and portable information terminals, and electronic devices, such as desktop computers, televisions, and outdoor sign boards.

The organic light-emitting display apparatus includes an anode, a cathode, and an organic emissive layer interposed between the anode and the cathode. A thin film such as the organic emissive layer may be formed using a deposition method. A deposition device includes a mask assembly for forming the thin film.

The above information disclosed in this Background section is only for enhancement of understanding of the background, and, therefore, it may contain information that does not form the prior art that is already known in this country to a person of ordinary skill in the art.

SUMMARY

Exemplary embodiments provide a mask assembly for thin film deposition.

Additional aspects will be set forth in part in the description which follows, and, in part, will be apparent from the disclosure, or may be learned by practice of the inventive concept.

An exemplary embodiment discloses a mask assembly for thin film deposition that includes: a mask frame including an opening, the mask frame disposed surrounding the opening; and a mask unit including: first masks mounted on the mask frame, the first masks extending in a first direction; a second mask disposed on the first masks, the second mask including: one open hole; and at least one foreign substance discharge hole; and a third mask disposed on the second mask, the third mask extending in a second direction and including deposition holes, wherein the second direction crosses the first direction, and wherein a substrate is disposed on the third mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding, and are incorporated in and constitute a part of this specification, illustrate exemplary embodiments, and, together with the description, serve to explain principles.

DETAILED DESCRIPTION OF THE ILLUSTRATED EMBODIMENTS

Figure 1:
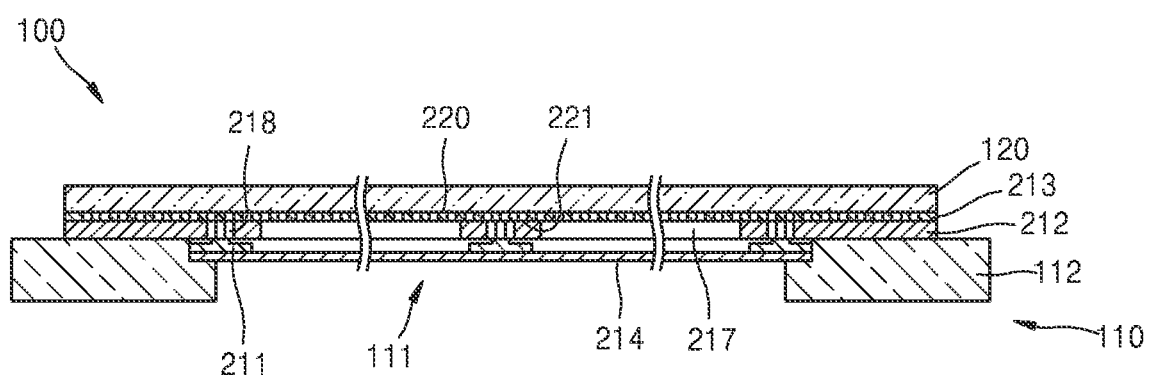
FIG. 1 is a cross-sectional view of a mask assembly for thin film deposition, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
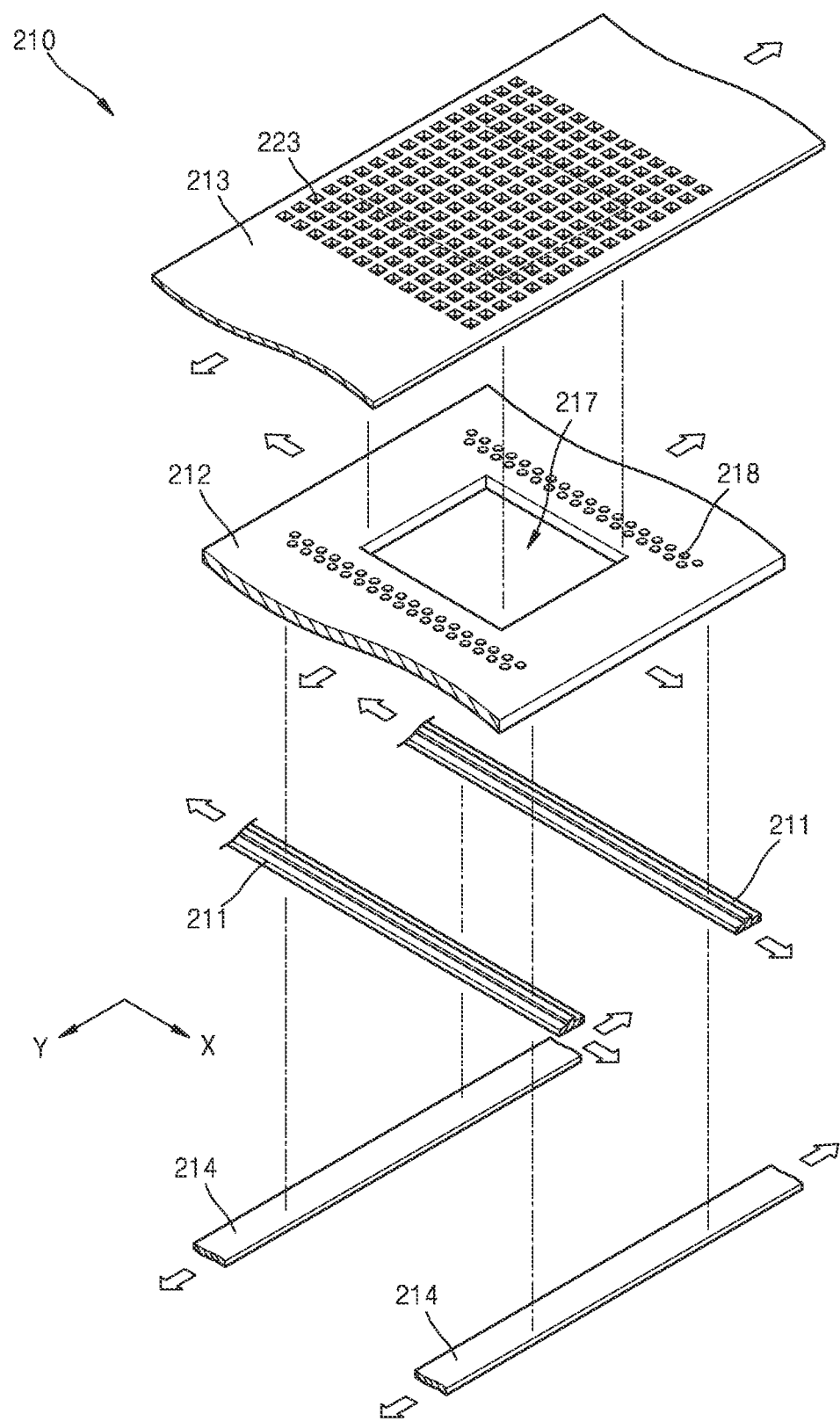
FIG. 2 is an exploded perspective view of a mask unit of FIG. 1.

FIG. 1 is a cross-sectional view of a mask assembly 100 for thin film deposition, according to an exemplary embodiment, and FIG. 2 is an exploded perspective view of a mask unit 210 of FIG. 1. Referring to FIG. 1 and FIG. 2, the mask assembly 100 may include a mask frame 110 and a mask unit 210 mounted on the mask frame 110.

The mask frame 110 may include a plurality of frames 112. The plurality of frames 112 may be connected to each other to form an opening 111. According to an exemplary embodiment, the mask frame 110 may be a rectangular frame. The mask frame 110 may be made of a material that resists deformation during welding of the mask unit 210, e.g., a metal having a high rigidity.

The mask unit 210 may include a first mask 211 mounted on the mask frame 110, a second mask 212 mounted on the first mask 211, and a third mask 213 mounted on the second mask 212. An auxiliary mask 214 may be further mounted between the mask frame 110 and the first mask 211.

The first mask 211 may extend in a first direction (i.e., an X direction). The first mask 211 may include at least two first masks 211. For example, the first masks 211 may be arranged spaced apart from each other in a second direction (i.e., a Y direction) that crosses the first direction. According to an exemplary embodiment, the first direction and the second direction may be orthogonal to each other. According to an exemplary embodiment, the first mask 211 may be a magnetic body such as Invar® (64FeNi) alloy.

The first mask 211 may be uniaxially tensioned in the first direction. Both ends of the first mask 211 in the first direction may be welded to the mask frame 110. In detail, the both ends of the first mask 211 may be tensioned in the first direction, and thereafter, be welded onto the mask frame 110.

The first mask 211 may reduce or prevent a deformation of the third mask 213. In addition, the first mask 211 may be mounted to reduce or prevent unnecessary deposition in a non-emission area of the third mask 213. According to an exemplary embodiment, the first mask 211 may be a strip shape having no deposition holes.

Figure 3:
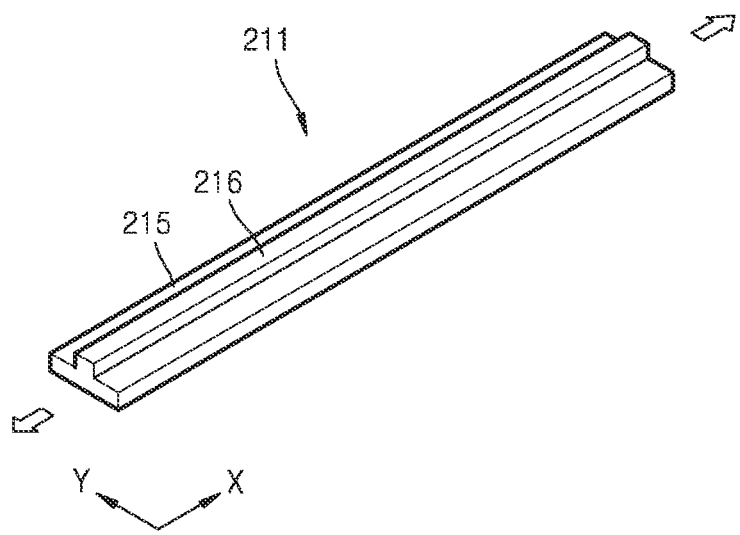
FIG. 3 is a perspective view of an exemplary embodiment of a first mask of FIG. 1.

In detail, referring to FIG. 3, the first mask 211 may include a first plate 215 extending in the first direction (the X direction). The first plate 215 may be a strip shape. A protrusion part 216 may protrude from an upper surface of the first plate 215. The protrusion part 216 may extend in a longitudinal direction (the X direction) of the first plate 215. The first plate 215 and the protrusion part 216 may be formed as one body. According to an exemplary embodiment, the protrusion part 216 may be formed by half-etching the first plate 215.

Figure 4:
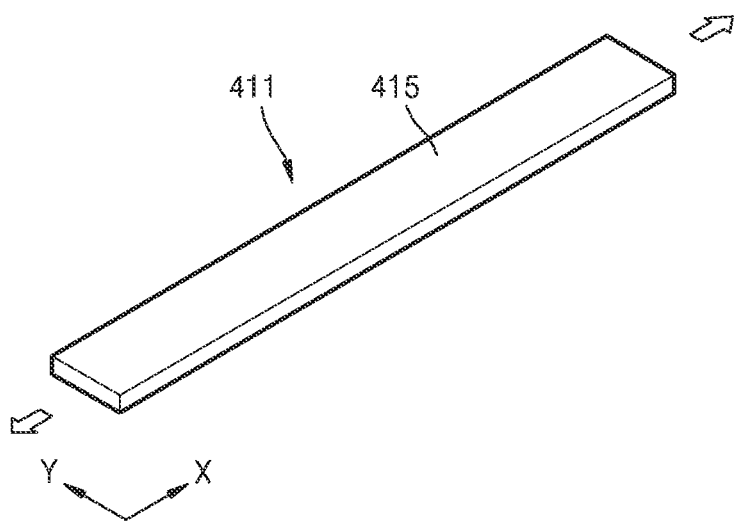
FIG. 4 is a perspective view of a modified exemplary embodiment of the first mask of FIG. 3.

Referring to FIG. 4, a first mask 411 may include only a plate 415. The plate 415 may extend in a longitudinal direction (the X direction). The plate 415 may be a strip shape having no deposition holes.

Referring back to FIG. 1 and FIG. 2, the second mask 212 may be mounted on the first mask 211. The second mask 212 may be disposed overlapping the first masks 211 arranged spaced apart from each other in the second direction (the Y direction). According to an exemplary embodiment, the second mask 212 may be a non-magnetic body such as stainless steel (SUS).

The second mask 212 has a flat plate shape. The second mask 212 may be biaxially tensioned in the first direction (the X direction) and the second direction (the Y direction). An edge of the second mask 212 is welded to the mask frame 110. The edge of the second mask 212 may be tensioned in both the first direction and the second direction simultaneously and be welded to the mask frame 110.

Figure 5:
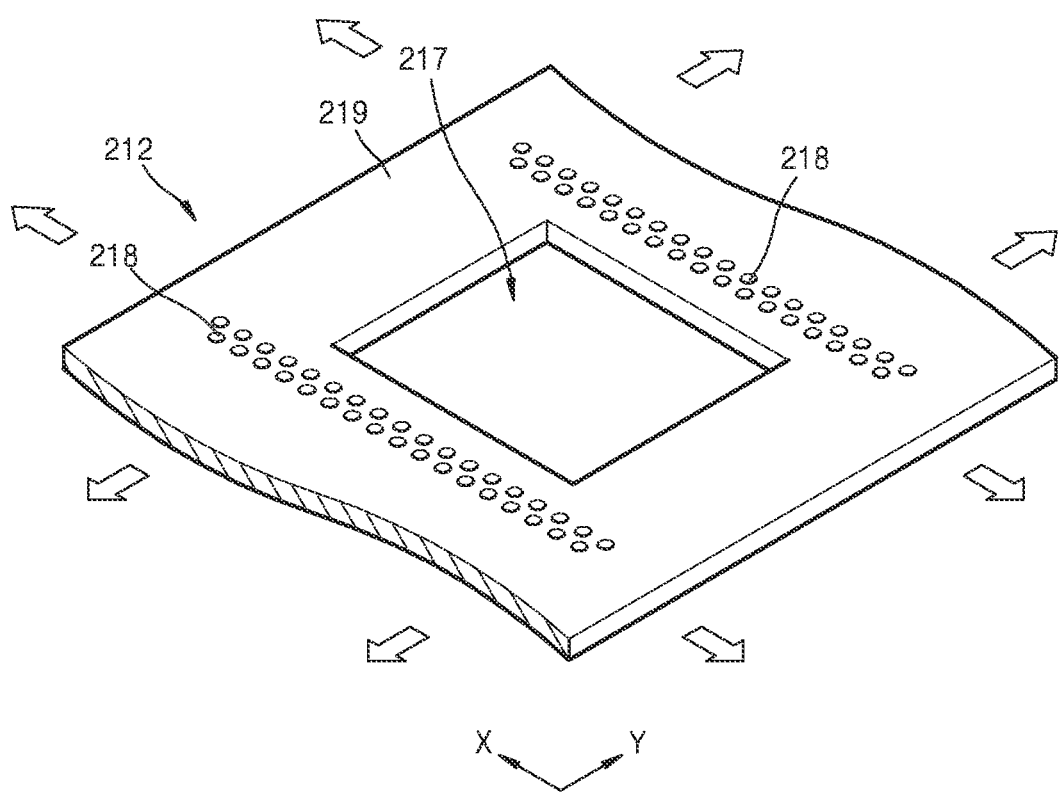
FIG. 5 is a perspective view of a second mask of FIG. 1.

The second mask 212 may have one open hole 217 and at least one foreign substance discharge hole 218. Referring to FIG. 5, the open hole 217 may be disposed in the center of the second mask 212. The open hole 217 corresponds to a deposition area of a substrate 120. According to an exemplary embodiment, the open hole 217 may be a single hole. The open hole 217 may have rectangular-shaped.

Foreign substance discharge holes 218 may be formed at respective sides of the open hole 217. The foreign substance discharge holes 218 correspond to a non-emission area of the substrate 120. According to an exemplary embodiment, the foreign substance discharge holes 218 may be arranged in the first direction (the X direction). The foreign substance discharge holes 218 may be a passageway through which particles in a chamber may be discharged during a deposition process.

According to an exemplary embodiment, the shape of the open hole 217 may have a shape different from the rectangular shape. For example, a circular open hole 815 may be formed in a second mask 811 (referring to FIG. 8A), an elliptical open hole 816 formed in a second mask 812 (referring to FIG. 8B), a triangular open hole 817 formed in a second mask 813 (referring to FIG. 8C), or a crisscross open hole 818 formed in a second mask 814 (referring to FIG. 8D). However, exemplary embodiments are not limited thereto, and the shape of the open hole 217 is not limited to any one shape as long as the open hole 217 corresponds to the deposition area of the substrate 120.

Figure 6:
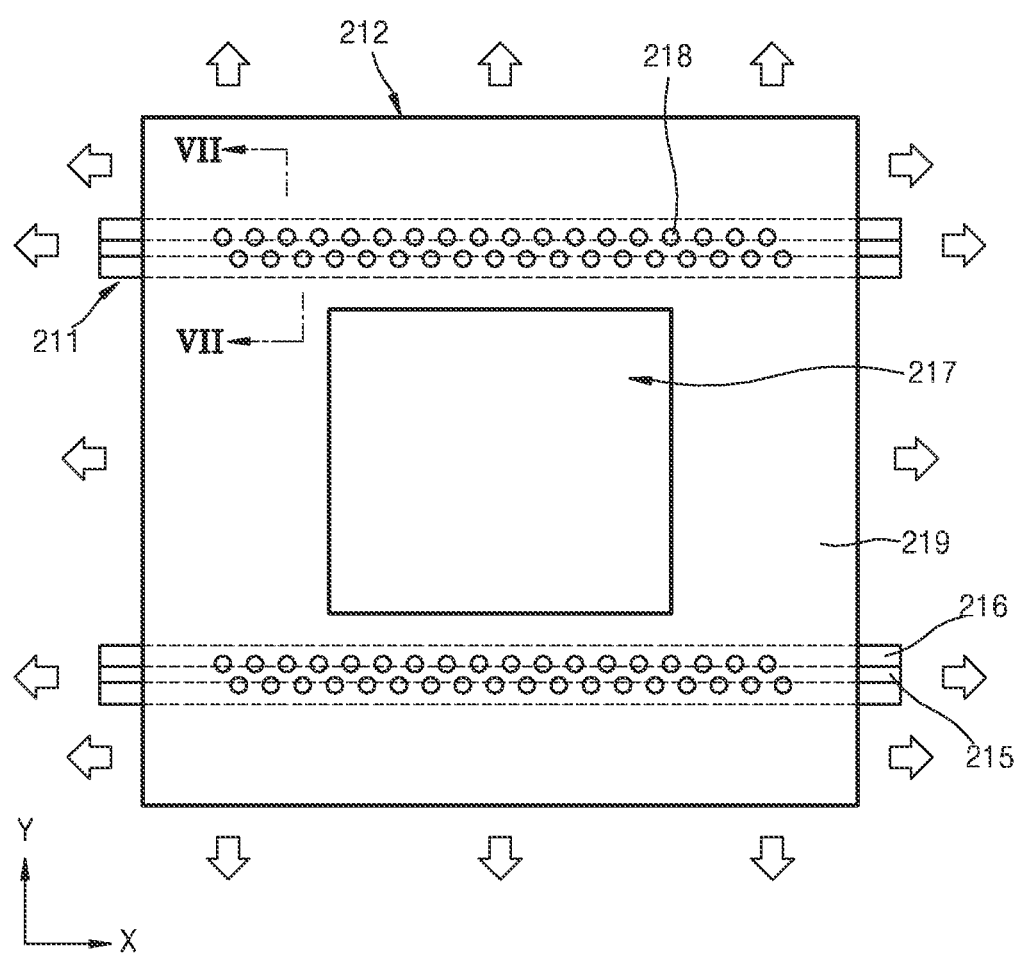
FIG. 6 is a top view illustrating an assembly of the first masks of FIG. 3 and the second mask of FIG. 5.
Figure 7:
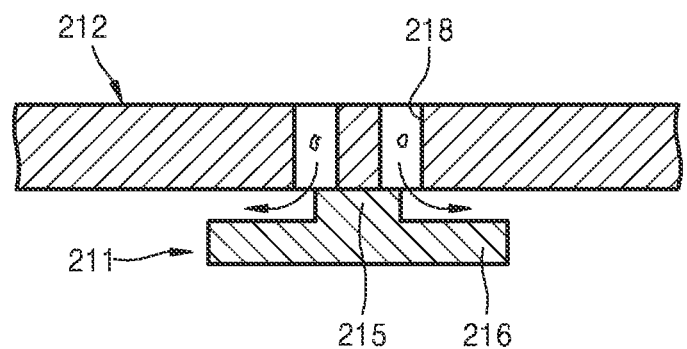
FIG. 7 is a cross-sectional view of the assembly taken along a section line VII-VII of FIG. 6.

FIG. 6 is a top view illustrating an assembly of the first masks 211 of FIG. 3 and the second mask 212 of FIG. 5, and FIG. 7 is a cross-sectional view of the assembly taken along a section line VII-VII of FIG. 6. Referring to FIG. 6 and FIG. 7, the first masks 211 may be arranged spaced apart from each other in the second direction (Y direction). The second mask 212 is disposed covering the first masks 211.

The open hole 217 disposed in the second mask 212 may be formed between the first masks 211. The foreign substance discharge holes 218 formed in the second mask 212 is disposed corresponding to the first masks 211.

The first masks 211 may cover a region in which the foreign substance discharge holes 218 are formed. Therefore, the first masks 211 may reduce or prevent a deposition material, evaporated from a deposition source (not shown) mounted below the first masks 211, from being deposited onto the substrate (120 of FIG. 1) through the foreign substance discharge holes 218. Furthermore, particles existing within the mask unit 210 may be discharged through the foreign substance discharge holes 218 during a deposition process.

Referring back to FIG. 1 and FIG. 2, the third mask 213 may be mounted on the second mask 212.

The third mask 213 may extend in the second direction (the Y direction). According to an exemplary embodiment, the third mask 213 may be a magnetic body such as Invar® alloy. The third mask 213 may have a flat plate shape. A first surface 220 of the third mask 213 is disposed facing the substrate 120, and a second surface 221 disposed opposite to the first surface 220 of the third mask 213 is disposed facing the second mask 212.

The third mask 213 may extend in the second direction (the Y direction) that crosses the first direction (the X direction). The third mask 213 may be uniaxially tensioned in the second direction. In detail, both ends of the third mask 213 in the second direction are welded to the second mask 212. In detail, the both ends of the third mask 213 in the second direction may be tensioned in the second direction and thereafter be welded onto the second mask 212. According to an exemplary embodiment, the third mask 213 may be welded to the mask frame 110. The third mask 213 has a plurality of deposition holes 223.

Figure 9:
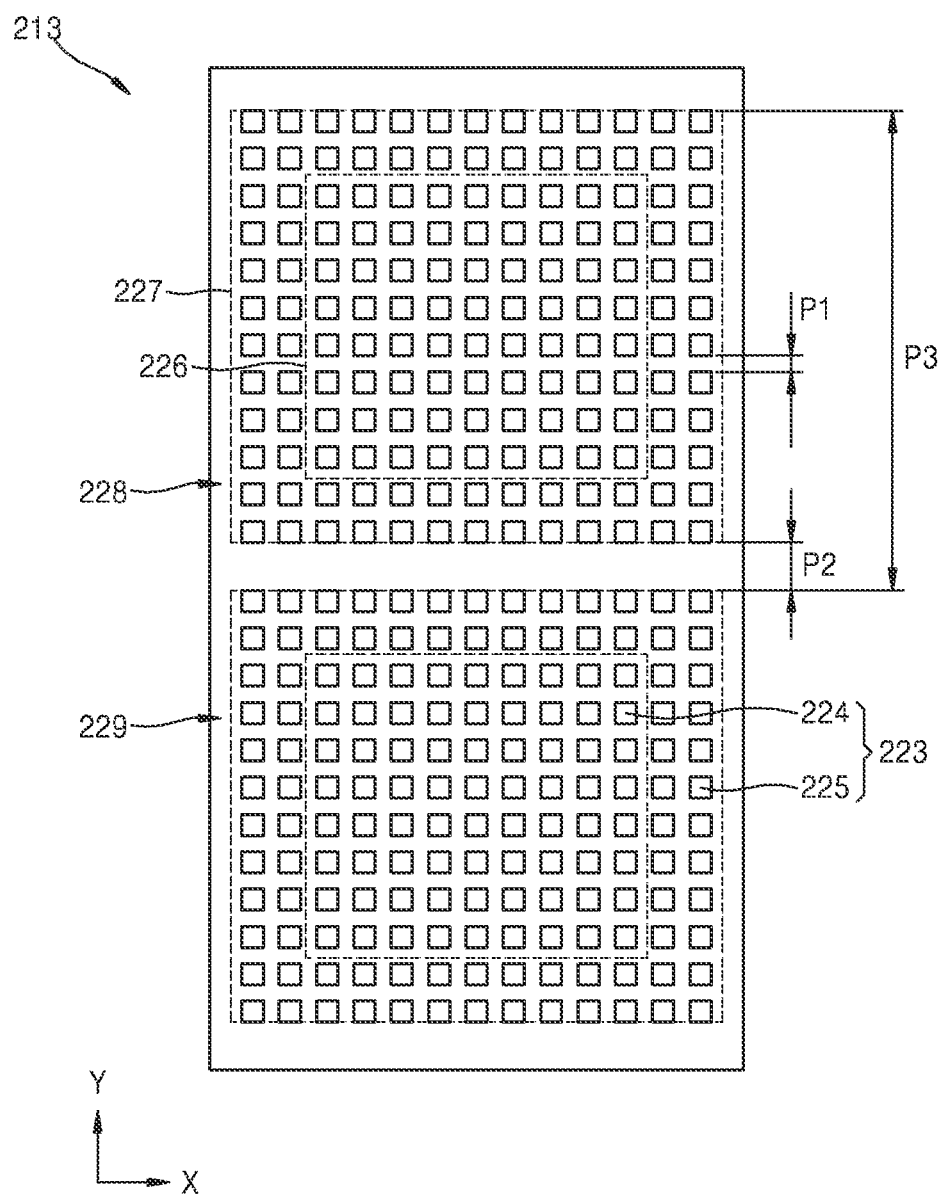
FIG. 9 is a top view illustrating a third mask of FIG. 1 extended, according to an exemplary embodiment.

FIG. 9 is a top view illustrating the third mask 213 of FIG. 1 extended, according to an exemplary embodiment.

An exemplary embodiment describes that the deposition patterns are formed on substrates 120. The substrates 120 may include separated substrates, or the substrates 120 may include a mother substrate which may be cut into multiple substrates after forming the deposition patterns on a mother substrate.

Referring to FIG. 9, the deposition holes 223 may be formed in the third mask 213. The deposition holes 223 may include first deposition holes 224 and second deposition holes 225.

The first deposition holes 224 may be formed in a first portion 226, corresponding to the deposition area of the substrate 120 (refer back to FIG. 1). The first deposition holes 224 may have a shape corresponding to a deposition pattern. The first deposition holes 224 are also disposed corresponding to the open hole 217 of the second mask 212 (refer back to FIG. 1).

The second deposition holes 225 may be formed in a second portion 227, corresponding to the non-emission area of the substrate 120, which is disposed surrounding the first portion 226. The second deposition holes 225 may be formed to uniformly apply a magnetic force of a magnet to the whole area of the third mask 213 during a deposition process. The first deposition holes 224 may have the same pattern as the second deposition holes 225.

Referring to FIGS. 1, 2, 3, 4, 5, 6, 7, 8A, 8B, 8C, 8D, and 9, the first mask 211, the second mask 212, and the third mask 213 may be disposed overlapping each other in an overlap area. The open hole 217 of the second mask 212 and the plurality of first deposition holes 224 correspond to the deposition area of the substrate 120.

According to an exemplary embodiment, the overlap area of the mask unit 210 may be arranged spaced apart from each other in the second direction (the Y direction), and overlap areas may correspond to the plurality of substrates 120, respectively. In this case, a second pitch P2 between a first area 228 of the third mask 213 corresponding to one substrate 120 and a second area 229 of the third mask 213 corresponding to an substrate 120 disposed adjacent to the substrate 120 may differ from a first pitch P1 between deposition holes 223 formed in each of the first and second areas 228 and 229.

In detail, the first area 228 of the third mask 213, in which the deposition holes 223 are arranged, is formed in the top side of FIG. 9, and the second area 229 of the third mask 213, in which the deposition holes 223 are arranged, is formed in the bottom side of FIG. 9. The first area 228 may have substantially the same shape and size as the second area 229.

A gap between neighboring deposition holes 223 disposed in the first area 228 and the second area 229 may be the first pitch P1. A gap between the first area 228 and the second area 229, i.e., a shortest gap between deposition holes 223 respectively arranged at the outermost portion of the first area 228 and the second area 229, may be the second pitch P2. A longest gap between deposition holes 223 respectively arranged at the outermost portion of the first area 228 and the second area 229 may be a third pitch P3. According to an exemplary embodiment, if a ratio of the third pitch P3 to the first pitch P1 between neighboring deposition holes 223 is not an integer, the size of the first pitch P1 may be different from the size of the second pitch P2. According to an exemplary embodiment, the second pitch P2 may be greater than the first pitch P1.

Referring back to FIG. 1 and FIG. 2, the mask assembly 100 may further include the auxiliary mask 214 disposed between the mask frame 110 and the first mask 211. The auxiliary mask 214 may extend in the second direction (the Y direction). The auxiliary mask 214 may be a strip-shaped plate. The auxiliary masks 214 may be disposed between the mask frame 110 and the first mask 211. For example, the plurality of auxiliary masks 214 may be arranged spaced apart from each other in the first direction (the X direction). According to an exemplary embodiment, the auxiliary mask 214 may be a non-magnetic body such as SUS.

The auxiliary mask 214 may be uniaxially tensioned in the second direction. Both ends of the auxiliary mask 214 in the second direction are welded to the mask frame 110. In detail, the both ends of the auxiliary mask 214 in the second direction may be tensioned in the second direction and thereafter welded onto the mask frame 110. The auxiliary mask 214 may be a plate having no deposition holes.

Figure 10:
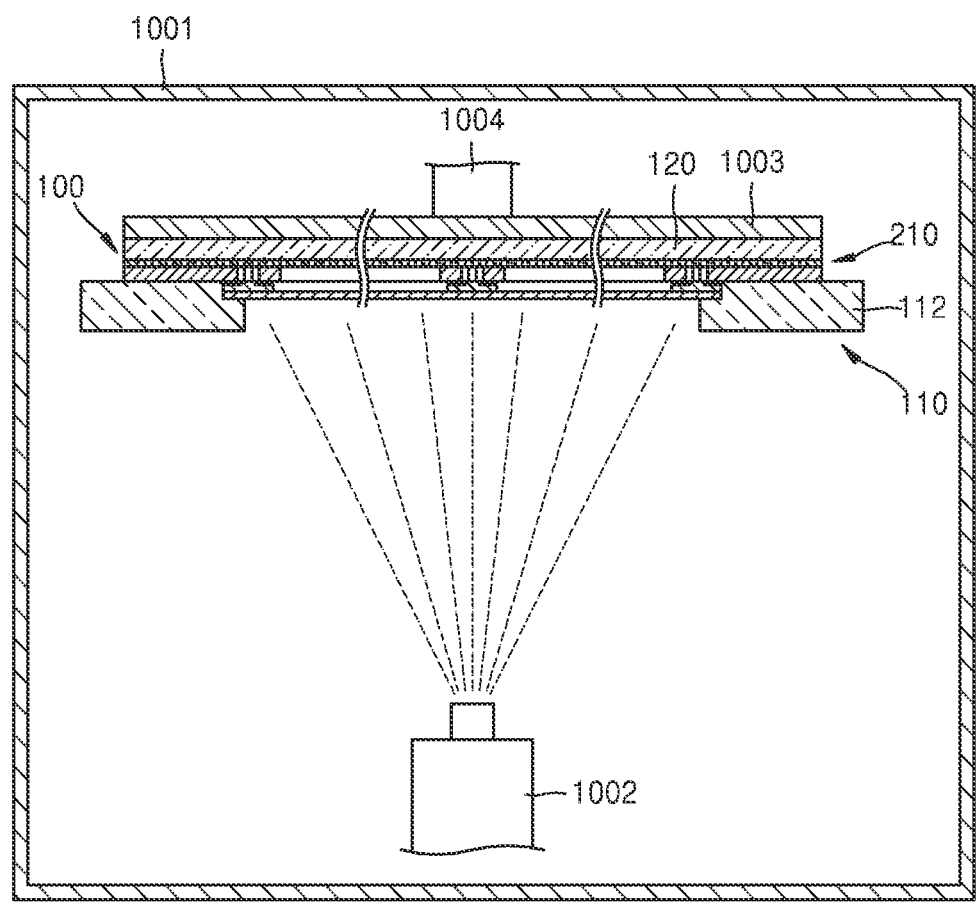
FIG. 10 is a cross-sectional view of a chamber illustrating an example of deposition of a thin film on a substrate using the mask assembly of FIG. 1.

FIG. 10 is a cross-sectional view of a chamber 1001 illustrating an example of deposition of a thin film on the substrate 120 using the mask assembly 100 of FIG. 1. Referring to FIG. 10, a chamber 1001 is prepared. According to an exemplary embodiment, the chamber 1001 may be a vacuum chamber for depositing an organic emissive layer of an organic light-emitting display apparatus.

A deposition source 1002 is disposed at a lower portion of the chamber 1001, and the mask assembly 100 may be mounted over the deposition source 1002. The mask unit 210 may be stacked on the mask frame 110. The substrate 120 on which deposition is performed may be located on the mask unit 210. A magnet 1003 may be mounted on the substrate 120.

A process of depositing a deposition material on the substrate 120 will now be described.

First, the substrate 120 is disposed on the mask unit 210. Next, the magnet 1003 is descended to the substrate 120 by an elevation unit 1004 and the magnet 1003 is attached with the outer surface of the substrate 120. In this case, the substrate 120 and the mask unit 210 are closely attached to each other by a magnetic force of the magnet 1003.

Thereafter, a deposition material is sprayed from the deposition source 1002 towards the mask assembly 100. An evaporated deposition material may be deposited on the deposition area of the substrate 120 by passing through the plurality of first deposition holes 224 (refer back to FIG. 9) of the third mask 213.

In this case, the at least one foreign substance discharge hole 218 (refer back to FIG. 5) formed in the second mask 212 is covered by the first mask 211 (refer back to FIG. 3), and thus, the deposition material is not deposited on the non-emission area of the substrate 120.

On the other hand, foreign substances generated in the mask unit 210, particularly, foreign substances remaining between the second mask 212 and the third mask 213 (refer back to FIG. 2) may be discharged downwards through the foreign substance discharge hole 218 during a deposition process and a cleaning process.

Figure 11:
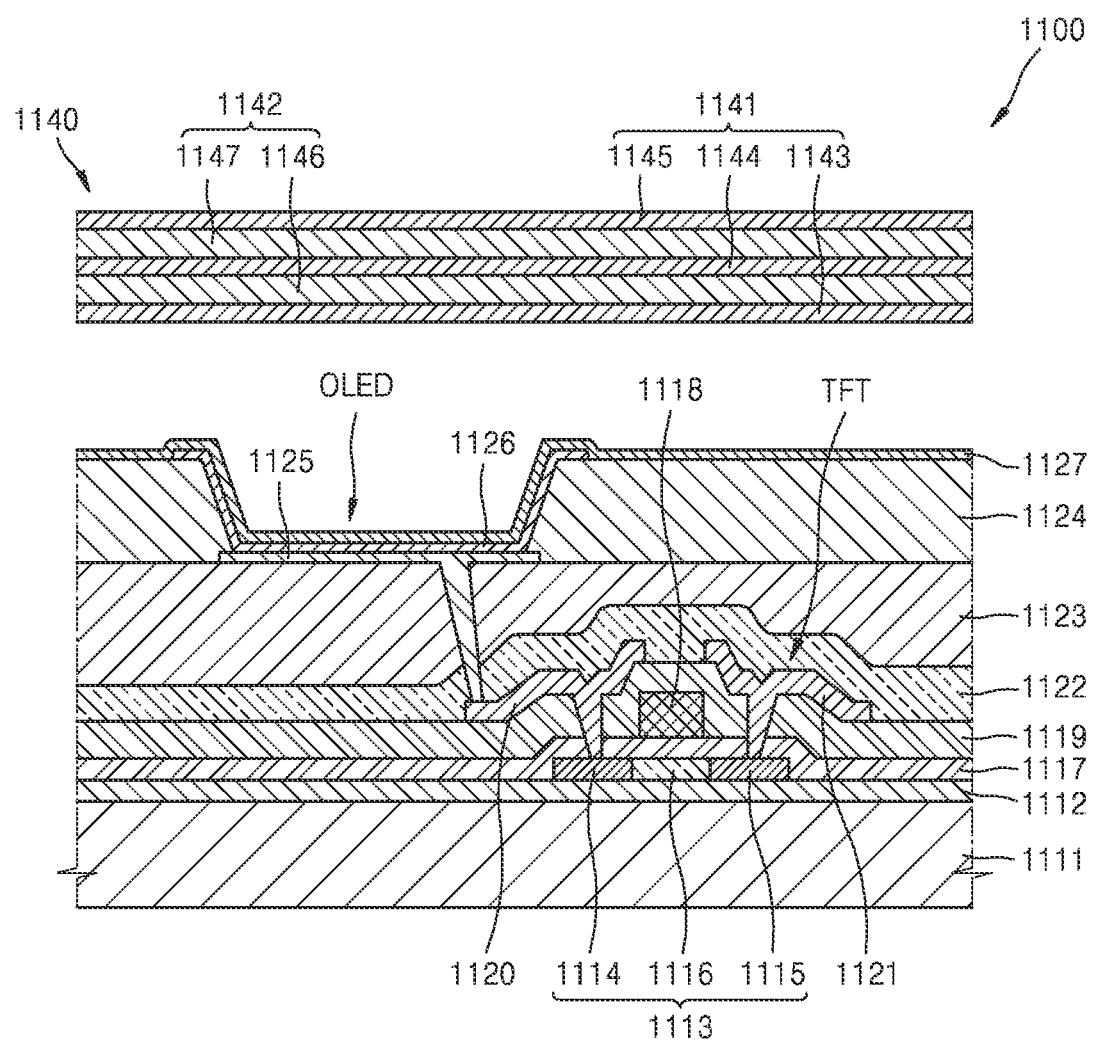
FIG. 11 is a cross-sectional view of a sub-pixel of an organic light-emitting display apparatus according to an exemplary embodiment.

FIG. 11 is a cross-sectional view of a sub-pixel of an organic light-emitting display apparatus 1100 according to an exemplary embodiment. Referring to FIG. 11, the organic light-emitting display apparatus 1100 may include a substrate 1111 and a thin-film encapsulation 1140 facing the substrate 1111. The substrate 1111 may be a glass substrate, a polymer substrate, and/or a flexible film substrate. The substrate 1111 may be transparent, translucent, or opaque.

A barrier layer 1112 may be formed on the substrate 1111. The barrier layer 1112 may completely cover an upper surface of the substrate 1111. The barrier layer 1112 may be formed of an inorganic material and/or an organic material. The barrier layer 1112 may be a single layer or multiple layers. The barrier layer 1112 may block oxygen and moisture from reaching a thin-film transistor TFT and planarize the upper surface of the substrate 1111.

A thin-film transistor TFT may be disposed on the barrier layer 1112. According to an exemplary embodiment, the thin-film transistor TFT may be a top gate transistor, but exemplary embodiments are not limited thereto, and the thin-film transistor TFT may be a bottom gate transistor or a thin-film transistor of another structure.

A semiconductor active layer 1113 may be disposed on the barrier layer 1112. The semiconductor active layer 1113 includes a source region 1114 and a drain region 1115 formed by doping edges of the semiconductor active layer 1113 with N-type impurity ions or P-type impurity ions. A channel region 1116 that is not doped with impurities is formed between the source region 1114 and the drain region 1115. The semiconductor active layer 1113 may be formed of an organic semiconductor, an inorganic semiconductor, and/or amorphous silicon. According to an exemplary embodiment, the semiconductor active layer 1113 may be formed of an oxide semiconductor.

A gate insulating layer 1117 may be disposed on the semiconductor active layer 1113. The gate insulating layer 1117 may be formed of an inorganic layer. The gate insulating layer 1117 may be a single layer or multiple layers.

A gate electrode 1118 may be disposed on the gate insulating layer 1117. The gate electrode 1118 may be formed of a metallic material having good conductivity. The gate electrode 1118 may be a single layer or multiple layers.

An interlayer insulating layer 1119 may be disposed on the gate electrode 1118. The interlayer insulating layer 1119 may be formed as an inorganic layer and/or an organic layer.

A source electrode 1120 and a drain electrode 1121 may be disposed on the interlayer insulating layer 1119. In detail, contact holes may be formed in the gate insulating layer 1117 and the interlayer insulating layer 1119 by removing a portion of the gate insulating layer 1117 and the interlayer insulating layer 1119, and the source electrode 1120 may be electrically connected to the source region 1114 through one contact hole and the drain electrode 1121 may be electrically connected to the drain region 1115 through the other contact hole, respectively.

A passivation layer 1122 may be disposed on the source electrode 1120 and the drain electrode 1121. The passivation layer 1122 may be formed as an inorganic layer and/or an organic layer. A planarization layer 1123 may be disposed on the passivation layer 1122. The planarization layer 1123 may include an organic layer. Any one of the passivation layer 1122 and the planarization layer 1123 may be omitted.

The thin-film transistor TFT may be electrically connected to an organic light-emitting display device OLED. The organic light-emitting display device OLED may be disposed on the planarization layer 1123. The organic light-emitting display device OLED may include a first electrode 1125, an intermediate layer 1126, and a second electrode 1127.

The first electrode 1125 may be an anode and may be formed of various conductive materials. The first electrode 1125 may include a transparent electrode or a reflective electrode. For example, when the first electrode 1125 is used as a transparent electrode, the first electrode 1125 includes a transparent conductive layer. When the first electrode 1125 is used as a reflective electrode, the first electrode 1125 includes a reflective layer and a transparent conductive layer formed on the reflective layer.

A pixel-defining layer 1124 covers the planarization layer 1123 and a portion of the first electrode 1125. The pixel-defining layer 1124 defines an emission area of each sub-pixel by covering the edges of the first electrode 1125. The first electrode 1125 may be patterned for each sub-pixel. The pixel-defining layer 1124 may be formed as an inorganic layer and/or an organic layer. The pixel-defining layer 1124 may be a single layer or multiple layers.

The intermediate layer 1126 may be disposed on the first electrode 1125 in a region exposed by the pixel-defining layer 1124. According to an exemplary embodiment, the intermediate layer 1126 may be formed by a deposition process. For example, the intermediate layer 1126 may be patterned using the mask assembly 100 of FIG. 1.

The intermediate layer 1126 may include an organic emission layer. According to an exemplary embodiment, the intermediate layer 1126 may include the organic emission layer, and may further include at least one of a hole injection layer (HIL), a hole transport layer (HTL), an electron transport layer (ETL), and an electron injection layer (EIL). However, exemplary embodiments are not limited thereto, and the intermediate layer 1126 may further include other various function layers.

The second electrode 1127 may be disposed on the intermediate layer 1126. The second electrode 1127 may be a cathode. The second electrode 1127 may include a transparent electrode and/or a reflective electrode. For example, when the second electrode 1127 is a transparent electrode, the second electrode 1127 may include a metal layer and a transparent conductive layer disposed on the metal layer. When the second electrode 1127 is a reflective electrode, the second electrode 1127 may include a metal layer.

According to an exemplary embodiment, pixels may be formed on the substrate 1111, and each pixel may produce a red color, green color, blue color, or white color. However, the present embodiments are not limited thereto.

According to an exemplary embodiment, the intermediate layer 1126 may be commonly disposed on all the first electrodes 1125 regardless of positions of sub-pixels. The organic emission layer may include layers of emission materials respectively configured to emit a red light, a green light, and a blue light, vertically stacked or mixed.

According to an exemplary embodiment, combination of other colors may be used so long as it may emit white light. In addition, a color conversion layer and/or a color filter for converting the emitted white light into a predetermined color may be further included.

The encapsulation 1140 may be disposed to protect the organic light-emitting display device OLED from external moisture, oxygen, and the like. According to an exemplary embodiment, the encapsulation 1140 may be formed by alternately stacking an inorganic layer 1141 and an organic layer 1142. For example, the inorganic layer 1141 may include a first inorganic layer 1143, a second inorganic layer 1144, and a third inorganic layer 1145. The organic layer 1142 may include a first organic layer 1146 and a second organic layer 1147.

Figure 12A:
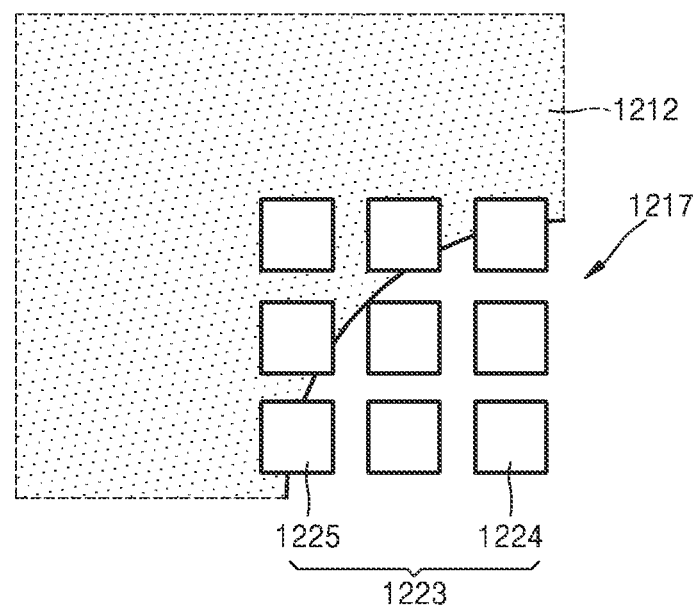
FIG. 12A is a partial magnified cut-away view illustrating a position correlation between an open hole of a second mask and deposition holes of a third mask, according to an exemplary embodiment.
Figure 12B:
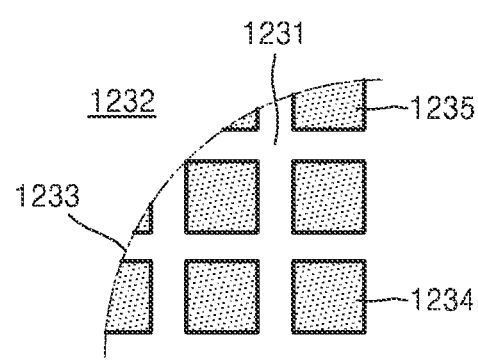
FIG. 12B is a partial magnified cut-away view of deposition patterns formed by a deposition material deposited onto a substrate through the open hole and the deposition holes of FIG. 12A.

FIG. 12A is a partial magnified cut-away view illustrating a position correlation between an open hole 1217 of a second mask 1212 and deposition holes 1223 of a third mask, according to an exemplary embodiment, and FIG. 12B is a partial magnified cut-away view of deposition patterns 1234 and 1235 formed by a deposition material deposited on a substrate by a deposition material which has passed through the open hole 1217 and the deposition holes 1223 of FIG. 12A.

Figure 8A:
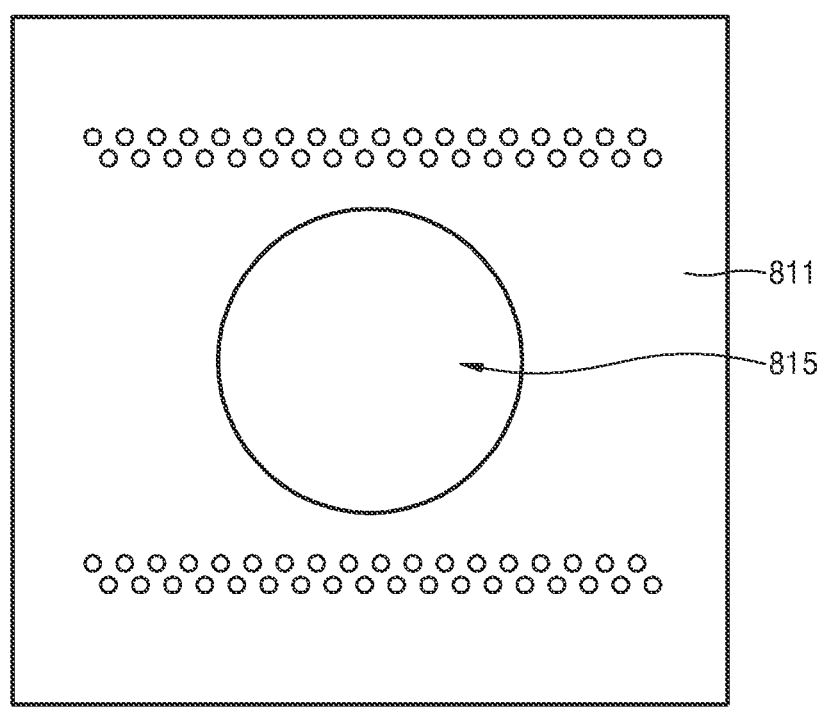
FIGS. 8A, 8B, 8C, and 8D are top views illustrating modified exemplary embodiments of the second mask of FIG. 1.
Figure 8B:
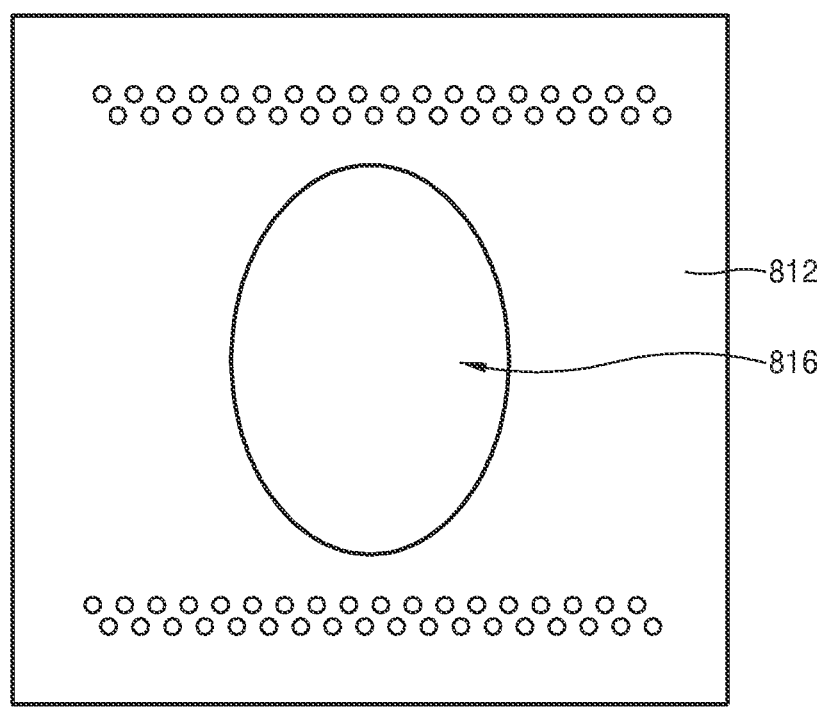
Figure 8C:
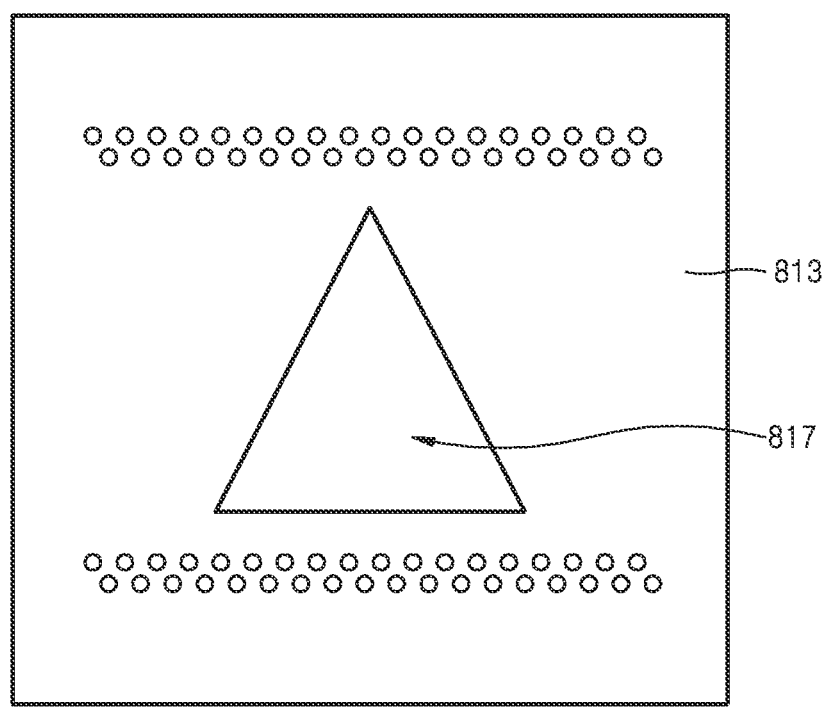
Figure 8D:
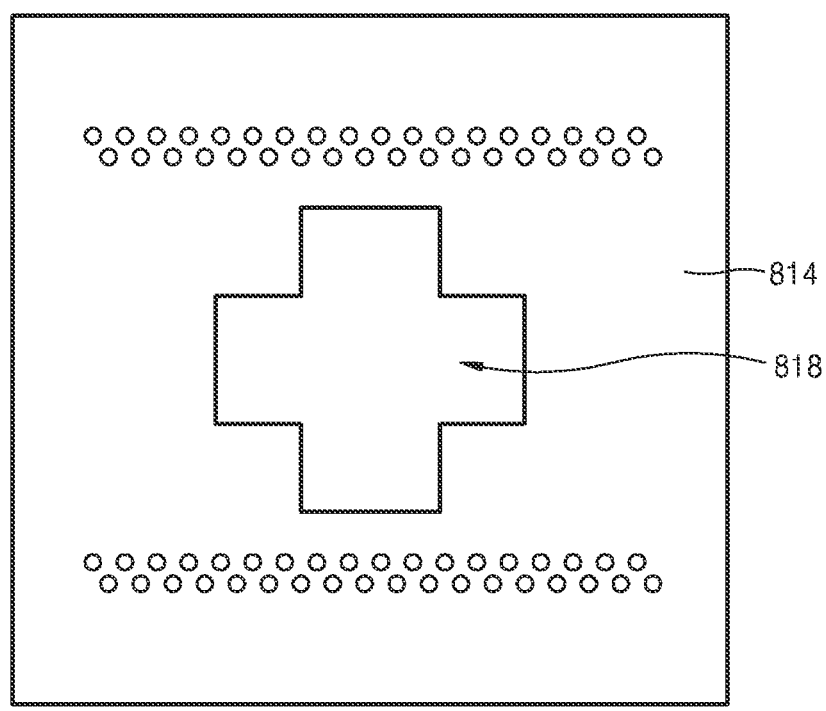

Referring to FIG. 12A and FIG. 12B, the second mask 1212 may have the one open hole 1217. The open hole 1217 may be circular-shaped as shown in FIG. 8A. The open hole 1217 corresponds to a deposition area 1231 of a substrate to be deposited.

The third mask 213 (refer back to FIG. 2) disposed on the second mask 1212 may have deposition holes 1223. The deposition holes 1223 may include first deposition holes 1224 corresponding to the deposition area 1231 of the substrate and a plurality of second deposition holes 1225 corresponding to a non-emission area 1232 of the substrate.

A deposition material evaporated from a deposition source 1002 (refer to FIG. 10) is deposited on the deposition area 1231 of the substrate, e.g., an active area, by passing through the open hole 1217 and the first deposition holes 1224. Accordingly, patterns 1234 of an organic emission layer may be formed in the deposition area 1231.

However, fragmented patterns 1235 are not deposited in a border 1233 between the deposition area 1231 and the non-emission area 1232 since the plurality of second deposition holes 1225 are hidden by the second mask 1212. The fragmented patterns 1235 do not substantially emit light.

According to the one or more exemplary embodiments, a mask assembly for thin-film deposition may provide an improved close contact force between a substrate supported by a magnet and a mask unit during a deposition process, to provide a pattern on the substrate.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A mask assembly for thin film deposition, the mask assembly comprising:
   a mask frame comprising an opening, the mask frame disposed surrounding the opening; and
   a mask unit comprising:
      first masks mounted on the mask frame, the first masks extending in a first direction;
      a second mask disposed on the first masks, the second mask comprising:
         one open hole; and
         at least one foreign substance discharge hole; and
      a third mask disposed on the second mask, the third mask extending in a second direction and comprising deposition holes,
   wherein the second direction crosses the first direction,
   wherein a substrate is disposed on the third mask,
   wherein the one open hole and the at least one foreign substance discharge hole are disposed on a surface of the second mask defined by the first direction and the second direction,
   wherein the open hole and the foreign substance discharge holes are formed to pass through the second mask in a third direction,
   wherein the third direction is perpendicular to the surface of the second mask defined by the first direction and the second direction, and wherein the at least one foreign substance discharge hole completely overlaps with the first masks in the third direction.

2. The mask assembly of claim 1, wherein the first masks are disposed spaced apart from each other in the second direction, and
wherein the first masks are uniaxially tensioned in the first direction.

3. The mask assembly of claim 2, wherein the first masks are a strip shape having no deposition holes.

4. The mask assembly of claim 3, wherein each of the first masks comprises:
a first plate extending in the first direction; and
a first protrusion part protruding from the first plate and extending in the first direction.

5. The mask assembly of claim 3, wherein each of the first masks comprises a plate extending in the first direction.

6. The mask assembly of claim 1, wherein the second mask is disposed overlapping the first masks, and
wherein the second mask is biaxially tensioned in the first direction and the second direction.

7. The mask assembly of claim 6, wherein the open hole disposed in the second mask corresponds to a deposition area of the substrate.

8. The mask assembly of claim 6, wherein the at least one foreign substance discharge hole disposed in the second mask comprises foreign substance discharge holes arranged at both sides of the open hole, and
wherein the foreign substance discharge holes correspond to a non-emission area of the substrate.

9. The mask assembly of claim 8, wherein the foreign substance discharge holes are arranged along the first direction.

10. The mask assembly of claim 8, wherein the foreign substance discharge holes are disposed corresponding to the first masks.

11. The mask assembly of claim 1, wherein the third mask is uniaxially tensioned in the second direction.

12. The mask assembly of claim 11, wherein the deposition holes disposed in the third mask comprise:
first deposition holes corresponding to a deposition area of the substrate; and
second deposition holes corresponding to a non-emission area surrounding the deposition area.

13. The mask assembly of claim 12, wherein the plurality of first deposition holes correspond to the open hole disposed in the second mask.

14. The mask assembly of claim 1, further comprising auxiliary masks extending in the second direction disposed between the mask frame and the plurality of first masks.

15. The mask assembly of claim 14, wherein the auxiliary masks are disposed spaced apart from each other in the first direction, and
wherein the auxiliary masks are uniaxially tensioned in the second direction.

16. The mask assembly of claim 15, wherein the auxiliary masks have a strip shape.

17. The mask assembly of claim 1, wherein end portions of the first masks and an end portion of the second mask are welded to the mask frame.

18. The mask assembly of claim 17, wherein an end portion of the third mask is welded to the second mask.

19. The mask assembly of claim 1, wherein the first masks, the second mask, and the third mask are disposed overlapping each other in an overlap area, and
the open hole of the second mask and the deposition holes of the third mask, which are disposed in the overlap area, correspond to a deposition area.

20. The mask assembly of claim 19, wherein the overlap area comprises a first overlap area and a second overlap area arranged in the second direction spaced apart from each other,
wherein the substrate comprises a first substrate and a second substrate, the first substrate and the second substrate respectively corresponding to the first overlap area and the second overlap area, and
wherein a first pitch between deposition holes of the third mask is different from a second pitch between the first overlap area and the second overlap area.

* * * * *